United States Patent
Gillette

Patent Number: 5,955,890
Date of Patent: Sep. 21, 1999

[54] BACKMATCH RESISTOR STRUCTURE FOR AN INTEGRATED CIRCUIT TESTER

[75] Inventor: Garry C. Gillette, San Jose, Calif.

[73] Assignee: Credence Systems Corporation, Fremont, Calif.

[21] Appl. No.: 08/962,050

[22] Filed: Oct. 31, 1997

[51] Int. Cl.$^6$ .................................................. H03K 17/16
[52] U.S. Cl. ........................ 326/30; 324/158.1; 324/765
[58] Field of Search ................................ 324/765, 158.1; 371/22.1, 22.5, 22.6; 327/53; 326/30

[56] References Cited

U.S. PATENT DOCUMENTS

| | | | |
|---|---|---|---|
| 5,453,993 | 9/1995 | Kitaguchi et al. | 371/22.5 |
| 5,521,493 | 5/1996 | Persons | 324/158.1 |
| 5,760,599 | 6/1998 | Ehiro | 324/765 |

*Primary Examiner*—David Nelms
*Assistant Examiner*—Thong Le
*Attorney, Agent, or Firm*—Smith-Hill and Bedell

[57] ABSTRACT

A drive arrangement for a semiconductor integrated circuit tester having a tester pin connected by a transmission line to a terminal for engaging a pin of a semiconductor device under test (DUT) includes a driver having an output terminal which can be driven selectively to at least two voltage levels in response to a timing signal and multiple semiconductor resistive elements each having at least a first state, in which the resistive element is conductive, and a second state, in which the resistive element is substantially non-conductive. The resistive elements are connected as a two-terminal network between the output terminal of the driver and the tester pin. By selective control, the resistive elements can backmatch the characteristic impedance of the transmission line.

16 Claims, 2 Drawing Sheets

BACKMATCH RESISTOR STRUCTURE FOR AN INTEGRATED CIRCUIT TESTER

BACKGROUND OF THE INVENTION

This invention relates to a backmatch resistor structure for an integrated circuit tester.

In the testing of a semiconductor integrated circuit device, a driver is used to apply a voltage signal at a selected high or low level to an input pin of the device under test (DUT) in order to place the DUT in a desired state. It is sometimes desirable to use a transmission line, such as a coaxial cable or a microstrip structure, for signal propagation between an output pin of the tester and an input pin of the DUT. It is well known that it is desirable to backmatch the output resistance of the driver with the characteristic impedance of the transmission line in order to avoid reflections in the signal path between the driver and the input pin of the DUT.

It has been conventional to employ a transmission line having a characteristic impedance of 50 ohms and to use a 50 ohm series backmatch output resistance in the driver to series terminate the transmission line at its source. However, it is difficult to maintain a constant 50 ohm characteristic impedance in practical transmission line structures, and variations of +/−3 ohms are quite common in practical implementations. A 3 ohm error in transmission line impedance results in a 6% initial amplitude error in the pulse delivered to the DUT input pin. An amplitude error of 6% may be greater than the tolerance allowed in testing. Further, the only practical way to produce an accurate 50 ohm backmatch impedance in a driver of the kind described above has been by laser trimming a resistor on the driver circuit, which is complex and expensive. Moreover, a characteristic impedance of 50 ohms is not always optimal.

It is known to use CMOS transmission gates in an SPDT switch configuration to force the output of a driver in a semiconductor tester to selected input high and input low voltage levels, in order to generate a desired pulse waveform for application to the input pin of the DUT. A pullup transmission gate is connected the output of the driver and a rail at the desired high input voltage level and a pulldown transmission gate is connected between the output of the driver and a rail at the desired low input voltage level. A timing generator is associated with each transmission gate for changing its state at accurately controlled times relative to the start of a test cycle.

In CMOS technology, it is not generally possible to obtain both high breakdown voltage and high switching speed, i.e. high speed devices generally have a relatively low breakdown voltage and conversely devices having a high breakdown voltage have a relatively low switching speed.

The pullup and pulldown transmission gates used in the driver described above are active components, in that the waveform at the output of the driver is generated by the switching action of the transmission gates. The transmission gates must have a very rapid switching action in order to generate narrow pulses. This requirement therefore limits the range of voltages that can be applied to the DUT pin by the driver.

It is also desirable in a highly integrated tester, in which relays are not practical due to space constraints, for the leakage current of the driver when disconnected from the tester pin to be low when carrying out parametric measurement unit (PMU) tests, since the leakage current adds to the measurement current and can corrupt the measurement.

SUMMARY OF THE INVENTION

In accordance with a first aspect of the invention there is provided a drive arrangement for a semiconductor integrated circuit tester having a tester pin connected by a transmission line to a terminal for engaging a pin of a semiconductor device under test (DUT), said drive arrangement comprising a driver having an output terminal which can be driven selectively to at least two voltage levels in response to a timing signal, and a plurality of semiconductor resistive elements each having at least a first state, in which the resistive element is conductive, and a second state, in which the resistive element is substantially non-conductive, and wherein the resistive elements are connected as a two-terminal network between the output terminal of the driver and the tester pin, whereby the resistive elements can be selectively controlled for backmatching the characteristic impedance of the transmission line.

In accordance with a second aspect of the invention there is provided a drive arrangement for a semiconductor integrated circuit tester having a tester pin connected by a transmission line having a characteristic impedance Z0 to a terminal for engaging a pin of a semiconductor device under test (DUT), said driver structure comprising a driver having an output terminal which can be driven selectively to at least two voltage levels in response to a timing signal, the driver having an output resistance R0, an array of parallel CMOS transmission gates connected between said output terminal and said tester pin, each semiconductor resistor device having at least a first state and a second state, and a control means for selecting the states of the transmission gates respectively so that they have a resistance $R_{SW}$ substantially equal to Z0−R0.

BRIEF DESCRIPTION OF THE DRAWINGS

For a better understanding of the invention, and to show how the same may be carried into effect, reference will now be made, by way of example, to the accompanying drawings, in which.

DETAILED DESCRIPTION

Figure 1:
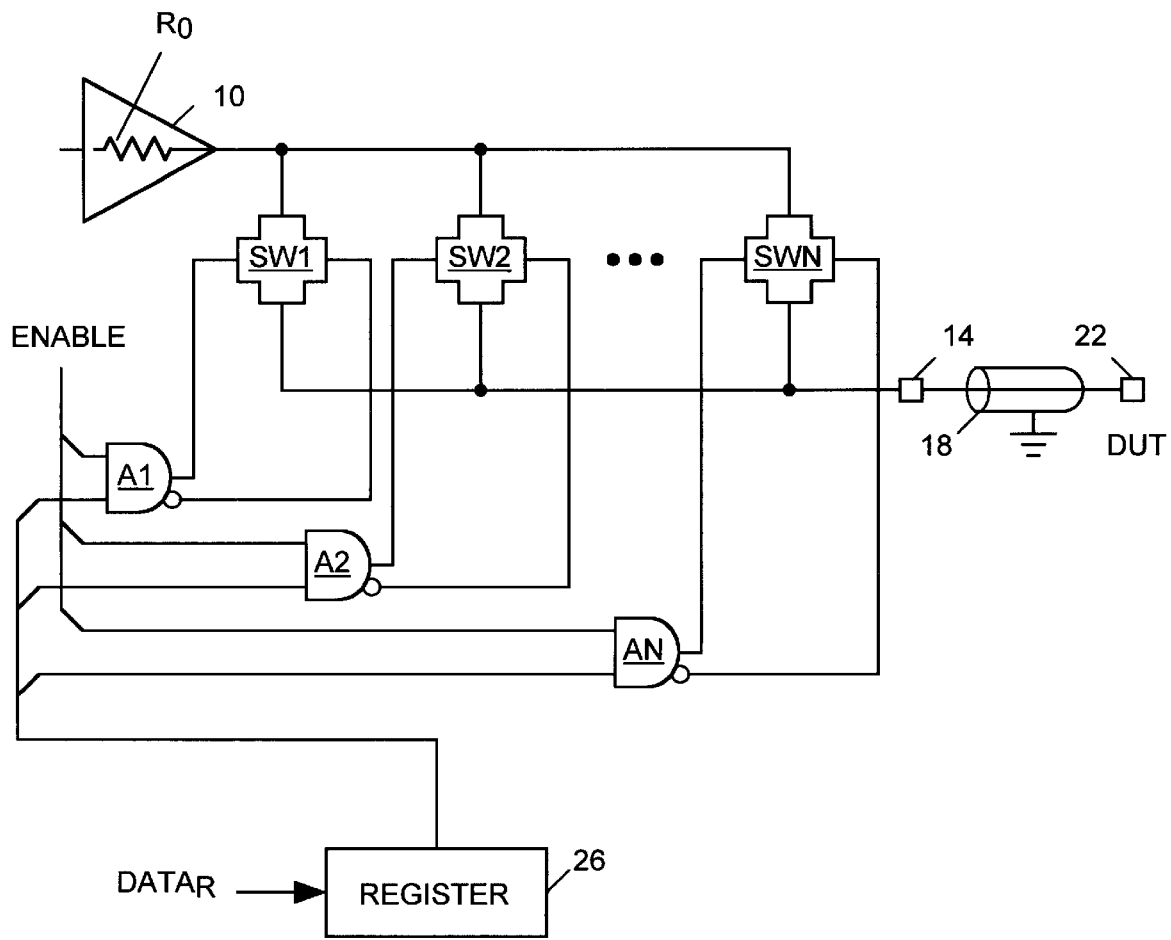
FIG. 1 is a schematic block diagram of a portion of a semiconductor tester in accordance with the present invention.

FIG. 1 illustrates a driver 10 having a PNP/NPN emitter follower as its output stage. The output resistance of such a driver is quite small and depends only slightly on whether it is driving high or low. The output resistance of the driver 10 is schematically represented by a resistor $R_O$. The output terminal of the driver is connected through an arrangement of parallel switches $SW_1$–$SW_N$, which are fabricated in an integrated circuit die using CMOS technology, to a tester pin 14, which is connected through a transmission line 18 to an input pin 22 of the DUT. Each switch SW has an enabled, or closed, state in which it is conductive and a disabled, or open, state in which it is non-conductive and may be implemented by a CMOS transmission gate (T-gate). Each switch has two control gate terminals and is enabled when one terminal is high and the other terminal is low, and is disabled when the terminals are in the opposite respective states. The switches SW are of binary weighted conductance, such that the conductance of the switch $SW_1$, when enabled, is twice that of the switch $SW_2$, which in turn is twice that of the switch $SW_3$, and so on. This provides ($2^N$−1) selectable resistance values. The combination in which the switches SW are enabled determines the value of the resistance between the output terminal of the driver 10 and the tester pin 14.

N AND gates $A_1$–$A_N$ and a register 26 storing a data word $DATA_R$ composed of N binary values $R_1$–$R_N$ are integrated in the same die as the switches $SW_1$–$SW_N$. Each AND gate $A_i$ (i=1 . . . N) has one input connected to an output of the register 26 and a second input connected to receive a signal ENABLE, which is distributed to all the AND gates. The signal ENABLE is in the logic one state when the output terminal of the driver 10 is to be connected to the tester pin 14 and is otherwise in the logic zero state. Each AND gate $A_i$ has one (non-inverted) output connected to one terminal of the switch $SW_i$ and a second (inverted) output connected to the other terminal of the switch. In this manner, the AND gate $A_i$ controls the state of the switch $SW_i$ depending on the value $R_i$.

A data word $DATA_R$ is loaded into the register 26. The resistance value $R_{SW}$ of the switches $SW_1$–$SW_N$ is established by the value of the word $DATA_R$. If, for example, the switches $SW_1$ and $SW_2$ only are to be enabled and the other switches $SW_3$–$SW_N$ are to be disabled, the register 26 is loaded with the data word (1, 1, 0, 0, . . . , 0). In this case, the outputs $R_1$ and $R_2$ of the register are in the logic one state and the other outputs $R_3$–$R_N$ are in the logic zero state. When the signal ENABLE is high, the switches $SW_1$ and $SW_2$ are closed (conductive) and the switches $SW_3$–$SW_N$ are open (non-conductive). The resistance range of the switches $SW_1$–$SW_N$ is typically from 50 ohms to 5,000 ohms and the resistance can be specified to very good resolution.

The value of the backmatch resistance provided by the switches SW is somewhat less than the characteristic impedance of the transmission line 18, because of the finite output resistance of the driver 10. Thus, the switches SW are enabled in a pattern such that the sum of the output resistance R0 of the driver and the resistance $R_{SW}$ of the switches SW is equal to the characteristic impedance of the transmission line.

The switches SW are passive and need only be switched at a rate determined by change in function of the test system pin (output pin versus input pin), which permits a much longer switching time than that required for the pullup and pulldown transmission gates used in the prior art driver mentioned above. Since the switching time can be relatively long, a high voltage CMOS process can be used in fabrication of the switches. When the switches are in the disabled state, they can withstand a high voltage on the test pin, which is desirable in testing of non-volatile technology devices, in which higher voltages than that of the power supply are routinely used in testing the device inputs.

Figure 2:
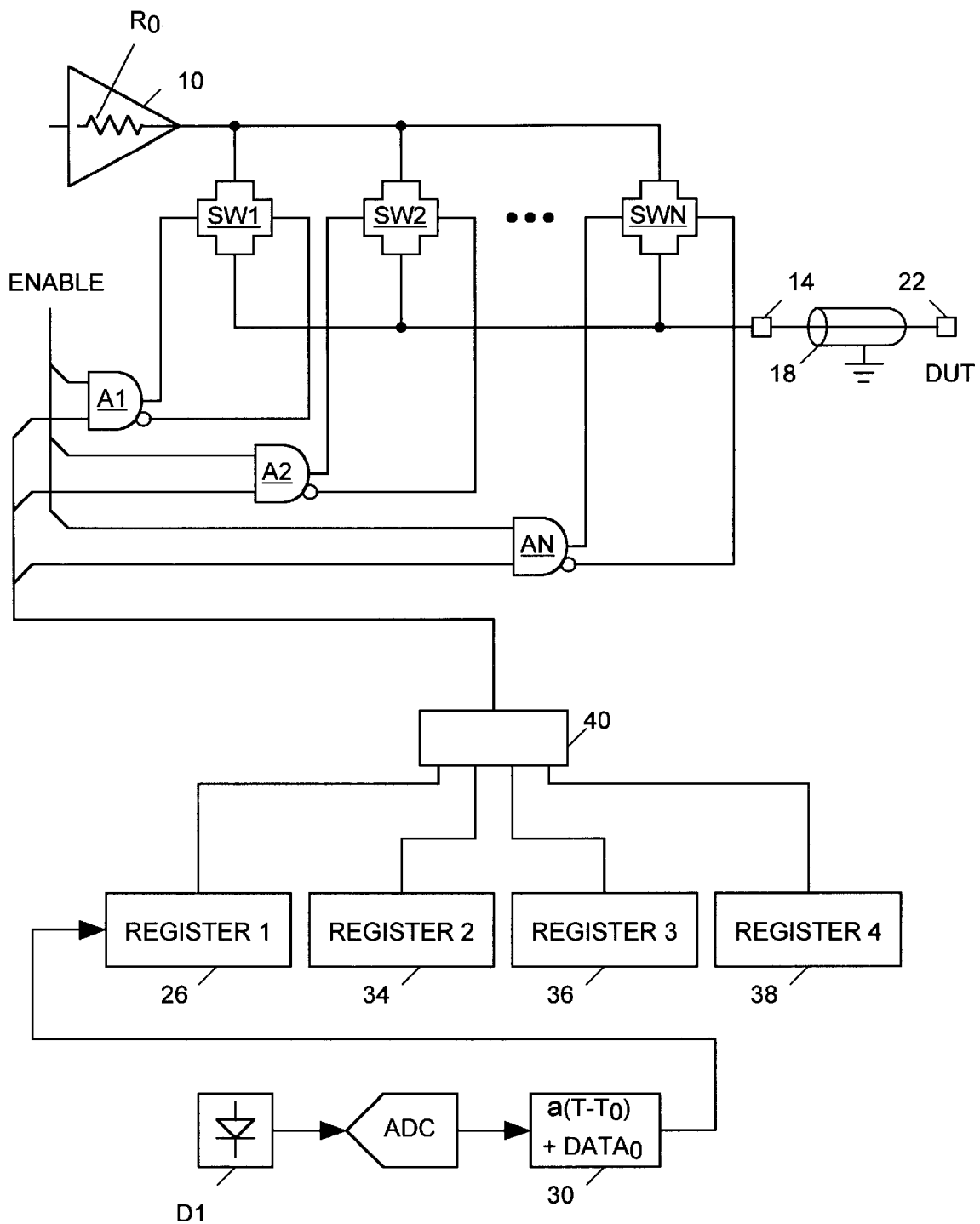
FIG. 2 is a schematic diagram of a portion of a second semiconductor tester in accordance with the present invention.

The resistance of the CMOS switches $SW_1$–$SW_N$ will vary as a function of temperature, typically increasing 1% per degree C. over a fairly wide range of temperatures. Accordingly, a change in temperature of the integrated circuit die in which the switches are fabricated will have a significant effect on the resistance $R_{SW}$ of a given combination of switches SW. Referring to FIG. 2, a diode D1 is formed in the same integrated circuit die as the switches SW and can be used to generate a voltage signal which is proportional to temperature. If the data value to be stored in the register 26 to achieve a desired resistance value is calibrated at a temperature $T_0$, at which the voltage signal provided by the diode has a value $V_0$, then the data value required to program the register during operation at a temperature T, at which the voltage signal provided by the diode has a value $V_T$, can be expressed as $$DATA_R = a(T-T_0) + DATA_0$$

where a is a constant.

In order to compensate for the effect of temperature on load resistance, the voltage signal provided by the diode D1 is converted to digital form and is used as one input to a mathematical function 30, such as a look-up table, which receives the value $DATA_0$ as another input and returns the value $DATA_R$. In this manner, the resistance value of the switches $SW_1$–$SW_N$ is rendered independent of temperature.

In another modification shown in FIG. 2, additional control registers 34, 36 and 38, each containing a preset value, are formed in the same integrated circuit die as the program register 26 and a 4×1 multiplexer 40 is connected between the outputs of the registers 26 and 34–38 and the inputs of the AND gates A1–AN. The multiplexer 40 is controlled by a control signal so that any one of the registers can be selected for providing the data word that selects the pattern in which the switches $SW_1$–$SW_N$ are to be enabled. By using the multiplexer to switch among the registers, the value in one of the control registers 34–38 can be selected without it being necessary to halt the test sequence and reload the program register 26, which is advantageous because reloading time is much longer than a cycle time.

Subject matter disclosed in this application is related to subject matter disclosed and claimed in one or more of Patent Application Ser. No. 08/961,645 filed Oct. 31, 1997, Patent Application Ser. No. 08/961,600 filed Oct. 31, 1997 and Patent Application Ser. No. 08/962,051 filed Oct. 31, 1997, the entire disclosure of each of which is hereby incorporated by reference herein.

It will be appreciated that the invention is not restricted to the particular embodiment that has been described, and that variations may be made therein without departing from the scope of the invention as defined in the appended claims and equivalents thereof. For example, the invention is not restricted to use of a driver in which the output stage has bipolar junction transistors, since the breakdown voltage needed at the tester pin can be supplied by the relatively slow (and high voltage) transmission gates of the backmatch resistor when in the disabled state and this then allows use of a driver having pullup and pulldown CMOS transmission gates having relatively low breakdown voltage and high switching speed. In this case, the pullup and pulldown transmission gates are designed to be of substantially equal impedance and the switches SW are enabled in a pattern such that the resistance $R_{SW}$ makes up the difference between the output impedance of the driver, which is a small fraction of the transmission line impedance, and the characteristic impedance of the transmission line.

I claim:

1. A drive arrangement for a semiconductor integrated circuit tester having a tester pin connected by a transmission line to a terminal for engaging a pin of a semiconductor device under test (DUT), said drive arrangement comprising:

a driver having an output terminal which can be driven selectively to at least two voltage levels in response to a timing signal, and a plurality of semiconductor resistive elements each having at least a first state, in which the resistive element is conductive, and a second state, in which the resistive element is substantially non-conductive, and wherein the resistive elements are connected as a two-terminal network between the output terminal of the driver and the tester pin, whereby the resistive elements can be selectively controlled for backmatching the characteristic impedance of the transmission line.

2. A drive arrangement according to claim 1, further comprising a selection means operable for selecting the state of each resistive element, whereby the resistance between the output terminal of the programmable voltage source and the tester pin can be selectively varied.

3. A drive arrangement according to claim 2, wherein the driver has an output impedance R0 and the selection means is operated to select the state of each resistive element so that the resistance between the output terminal of the driver and the tester pin is equal to the characteristic impedance of the transmission line minus R0.

4. A drive arrangement according to claim 1, wherein the resistive elements are connected in parallel between the output terminal of the driver and the tester pin.

5. A drive arrangement according to claim 1, wherein the resistive elements are of different respective conductances in the first state.

6. A drive arrangement according to claim 5, wherein the conductances of the resistive elements are in binary weighted relationship.

7. A drive arrangement according to claim 1, comprising a register for storing a data word specifying the state of each resistive element and a combinational logic means responsive to a control signal for utilizing the data word stored in the register to place the resistive elements in the specified states respectively.

8. A drive arrangement according to claim 7, wherein the switches are implemented in a CMOS integrated circuit and the CMOS integrated circuit includes a junction device providing a voltage signal representative of temperature of the integrated circuit and a function means for adjusting the data word stored in the register depending on the voltage signal.

9. A drive arrangement according to claim 1, comprising a program register for storing a program data word specifying a first combination of states of the resistive elements, at least one control register for storing a control data word specifying a second combination of states of the resistive elements, a multiplexer means for selecting one of the registers, and a combinational logic means responsive to an enable signal for utilizing the data word stored in the selected register to place the resistive elements in the combination of states specified by the data word stored in the selected register.

10. A drive arrangement for a semiconductor integrated circuit tester having a tester pin connected by a transmission line having a characteristic impedance Z0 to a terminal for engaging a pin of a semiconductor device under test (DUT), said driver structure comprising:

a driver having an output terminal which can be driven selectively to at least two voltage levels in response to a timing signal, the driver having an output resistance R0, an array of parallel CMOS transmission gates connected between said output terminal and said tester pin, each transmitter gate having at least a first state and a second state, and a control means for selecting the states of the transmission gates respectively so that they have a resistance $R_{SW}$ substantially equal to Z0−R0.

11. A drive arrangement according to claim 10, wherein the transmission gates are connected in parallel between the output terminal of the driver and the tester pin.

12. A drive arrangement according to claim 10, wherein the transmission gates are of different respective conductances in the enabled state.

13. A drive arrangement according to claim 12, wherein the conductances of the transmission gates are in binary weighted relationship.

14. A drive arrangement according to claim 10, comprising a register for storing a data word specifying the state of each transmission gate and a combinational logic means responsive to an enable signal for utilizing the data word stored in the register to place the transmission gates in the specified states respectively.

15. A drive arrangement according to claim 14, wherein the transmission gates are implemented in a CMOS integrated circuit which includes a junction device providing a voltage signal representative of temperature of the integrated circuit and a function means for adjusting the data word stored in the register depending on the voltage signal.

16. A drive arrangement according to claim 10, comprising a program register for storing a program data word specifying a first combination of states of the transmission gates, at least one control register for storing a control data word specifying a second combination of states of the transmission gates, a multiplexer means for selecting one of the registers, and a combinational logic means responsive to a timing signal for utilizing the data word stored in the selected register to place the transmission gates in the combination of states specified by the data word stored in the selected register.

* * * * *